(12) United States Patent
Nestel et al.

(10) Patent No.: US 6,833,636 B1
(45) Date of Patent: Dec. 21, 2004

(54) COMPACT LOAD BANK FOR TESTING POWER SYSTEMS

(75) Inventors: Steven U. Nestel, Ogden, UT (US); Sam W. Henry, Ogden, UT (US)

(73) Assignee: Chromalox, Inc., Pittsburgh, PA (US)

( * ) Notice: Subject to any disclaimer, the term of this patent is extended or adjusted under 35 U.S.C. 154(b) by 167 days.

(21) Appl. No.: 10/161,787

(22) Filed: Jun. 4, 2002

Related U.S. Application Data

(60) Provisional application No. 60/295,623, filed on Jun. 4, 2001.

(51) Int. Cl.⁷ .................................................. H02J 9/00
(52) U.S. Cl. .................................................... 307/154
(58) Field of Search .......................... 307/154; 324/426, 324/429

(56) References Cited

U.S. PATENT DOCUMENTS

| | | | | |
|---|---|---|---|---|
| 4,445,047 A | * | 4/1984 | Cannon | 307/31 |
| 5,416,416 A | * | 5/1995 | Bisher | 324/426 |
| 5,425,588 A | * | 6/1995 | Stemmle | 400/649 |

* cited by examiner

*Primary Examiner*—Adolf Berhane
(74) *Attorney, Agent, or Firm*—Kirkpatrick & Lockhart LLP

(57) ABSTRACT

A load bank, comprising a housing, a user interface located on the housing, the user interface having at least one control, and at least one heater located in the housing and controlled by the control, wherein the control configures the heater to act as a test load for testing a power source.

20 Claims, 8 Drawing Sheets

CONTINUED ON 7B

| Test Load | Selector Switch | Stage Switches | Test Load | Selector Switch | Stage Switches |
|---|---|---|---|---|---|
| 1-kW | 1-kW | None | 51-kW | 1-kW | 10-kW, 20-kW, 20-kW |
| 2-kW | 2-kW | None | 52-kW | 2-kW | 10-kW, 20-kW, 20-kW |
| 3-kW | 3-kW | None | 53-kW | 3-kW | 10-kW, 20-kW, 20-kW |
| 4-kW | 4-kW | None | 54-kW | 4-kW | 10-kW, 20-kW, 20-kW |
| 5-kW | 0-kW | 5-kW | 55-kW | 0-kW | 5-kw, 10-kW, 20-kW, 20-kW |
| 6-kW | 1-kW | 5-kW | 56-kW | 1-kW | 5-kw, 10-kW, 20-kW, 20-kW |
| 7-kW | 2-kW | 5-kW | 57-kW | 2-kW | 5-kw, 10-kW, 20-kW, 20-kW |
| 8-kW | 3-kW | 5-kW | 58-kW | 3-kW | 5-kw, 10-kW, 20-kW, 20-kW |
| 9-kW | 4-kW | 5-kW | 59-kW | 4-kW | 5-kw, 10-kW, 20-kW, 20-kW |
| 10-kW | 0-kW | 10-kW | 60-kW | 0-kW | 20-kw, 40-kW |
| 11-kW | 1-kW | 10-kW | 61-kW | 1-kW | 20-kw, 40-kW |
| 12-kW | 2-kW | 10-kW | 62-kW | 2-kW | 20-kw, 40-kW |
| 13-kW | 3-kW | 10-kW | 63-kW | 3-kW | 20-kw, 40-kW |
| 14-kW | 4-kW | 10-kW | 64-kW | 4-kW | 20-kw, 40-kW |
| 15-kW | 0-kW | 5-kw, 10-kW | 65-kW | 0-kW | 5-kW, 20-kW, 40-kW |
| 16-kW | 1-kW | 5-kw, 10-kW | 66-kW | 1-kW | 5-kW, 20-kW, 40-kW |
| 17-kW | 2-kW | 5-kw, 10-kW | 67-kW | 2-kW | 5-kW, 20-kW, 40-kW |
| 18-kW | 3-kW | 5-kw, 10-kW | 68-kW | 3-kW | 5-kW, 20-kW, 40-kW |
| 19-kW | 4-kW | 5-kw, 10-kW | 69-kW | 4-kW | 5-kW, 20-kW, 40-kW |
| 20-kW | 0-kW | 20-kW | 70-kW | 0-kW | 10-kw, 20-kW, 40-kW |
| 21-kW | 1-kW | 20-kW | 71-kW | 1-kW | 10-kw, 20-kW, 40-kW |
| 22-kW | 2-kW | 20-kW | 72-kW | 2-kW | 10-kw, 20-kW, 40-kW |
| 23-kW | 3-kW | 20-kW | 23-kW | 3-kW | 10-kw, 20-kW, 40-kW |
| 24-kW | 4-kW | 20-kW | 74-kW | 4-kW | 10-kw, 20-kW, 40-kW |
| 25-kW | 0-kW | 5-kw, 20-kW | 75-kW | 0-kW | 5-kw, 10-kW, 20-kW, 40-kW |
| 26-kW | 1-kW | 5-kw, 20-kW | 76-kW | 1-kW | 5-kw, 10-kW, 20-kW, 40-kW |
| 27-kW | 2-kW | 5-kw, 20-kW | 77-kW | 2-kW | 5-kw, 10-kW, 20-kW, 40-kW |
| 28-kW | 3-kW | 5-kw, 20-kW | 78-kW | 3-kW | 5-kw, 10-kW, 20-kW, 40-kW |
| 29-kW | 4-kW | 5-kw, 20-kW | 79-kW | 4-kW | 5-kw, 10-kW, 20-kW, 40-kW |
| 30-kW | 0-kW | 10-kw, 20-kW | 80-kW | 0-kW | 20-kW, 20-kW, 40-kW |
| 31-kW | 1-kW | 10-kw, 20-kW | 81-kW | 1-kW | 20-kW, 20-kW, 40-kW |
| 32-kW | 2-kW | 10-kw, 20-kW | 82-kW | 2-kW | 20-kW, 20-kW, 40-kW |
| 33-kW | 3-kW | 10-kw, 20-kW | 83-kW | 3-kW | 20-kW, 20-kW, 40-kW |

FIG. 6A

| Test Load | Selector Switch | Stage Switches |
|---|---|---|
| 34-kW | 4-kW | 10-kw, 20-kW |
| 35-kW | 0-kW | 5-kw, 10-kW, 20-kW |
| 36-kW | 1-kW | 5-kw, 10-kW, 20-kW |
| 37-kW | 2-kW | 5-kw, 10-kW, 20-kW |
| 38-kW | 3-kW | 5-kw, 10-kW, 20-kW |
| 39-kW | 4-kW | 5-kw, 10-kW, 20-kW |
| 40-kW | 0-kW | 20-kw, 20-kW |
| 41-kW | 1-kW | 20-kw, 20-kW |
| 42-kW | 2-kW | 20-kw, 20-kW |
| 43-kW | 3-kW | 20-kw, 20-kW |
| 44-kW | 4-kW | 20-kw, 20-kW |
| 45-kW | 0-kW | 5-kw, 20-kW, 20-kW |
| 46-kW | 1-kW | 5-kw, 20-kW, 20-kW |
| 47-kW | 2-kW | 5-kw, 20-kW, 20-kW |
| 48-kW | 3-kW | 5-kw, 20-kW, 20-kW |
| 49-kW | 4-kW | 5-kw, 20-kW, 20-kW |
| 50-kW | 0-kW | 10-kW, 20-kW, 20-kW |
| 84-kW | 4-kW | 20-kW, 20-kW, 40-kW |
| 85-kW | 0-kW | 5-kw, 20-kW, 20-kW, 40-kW |
| 86-kW | 1-kW | 5-kw, 20-kW, 20-kW, 40-kW |
| 87-kW | 2-kW | 5-kw, 20-kW, 20-kW, 40-kW |
| 88-kW | 3-kW | 5-kw, 20-kW, 20-kW, 40-kW |
| 89-kW | 4-kW | 5-kw, 20-kW, 20-kW, 40-kW |
| 90-kW | 0-kW | 10-kw, 20-kW, 20-kW, 40-kW |
| 91-kW | 1-kW | 10-kw, 20-kW, 20-kW, 40-kW |
| 92-kW | 2-kW | 10-kw, 20-kW, 20-kW, 40-kW |
| 93-kW | 3-kW | 10-kw, 20-kW, 20-kW, 40-kW |
| 94-kW | 4-kW | 10-kw, 20-kW, 20-kW, 40-kW |
| 95-kW | 0-kW | 10-kw, 20-kW, 20-kW, 40-kW |
| 96-kW | 1-kW | 5-kw, 10-kW, 20-kW, 20-kW, 40-kW |
| 97-kW | 2-kW | 5-kw, 10-kW, 20-kW, 20-kW, 40-kW |
| 98-kW | 3-kW | 5-kw, 10-kW, 20-kW, 20-kW, 40-kW |
| 99-kW | 4-kW | 5-kw, 10-kW, 20-kW, 20-kW, 40-kW |
| 100-kW | 5-kW | 5-kw, 10-kW, 20-kW, 20-kW, 40-kW |

FIG. 6B

COMPACT LOAD BANK FOR TESTING POWER SYSTEMS

CROSS REFERENCE TO RELATED APPLICATION

This application claims priority under 35 U.S.C. § 119 to U.S. Provisional Application No. 60/295,623 filed Jun. 4, 2001.

FIELD OF THE INVENTION

The present invention relates generally to load banks, and more particularly, to is a compact load bank for providing an electrical power load for testing power systems, such as generators and other backup power supplies, at different loads and voltages.

BACKGROUND OF THE INVENTION

Power systems such as generators and other backup supplies need to be tested. It has been known to use a load bank to provide a test load for such power systems. Typical known load banks are typically large and not easy to move. This makes testing of multiple power systems difficult as well as any subsequent storage of the load bank.

Additionally, conventional load banks do not permit testing a single load level at multiple voltages. For example, existing load banks are rated for their maximum load level at one voltage. This results in lower or higher load levels at other voltages. Further, conventional load banks generally do not provide the exact load level for which it is configured. This is due to manufacturing tolerances and other factors. Moreover, conventional load banks offer only a limited number of load levels between zero and maximum load.

SUMMARY OF THE INVENTION

In one embodiment, the present invention is directed to a load bank for testing a power source. The load bank has at least one terminal to connect to the power source and the load bank comprises a housing and a user interface attached to the housing, the user interface having a means for configuring a test load and a means for configuring a test voltage. The load bank also comprises a heater element assembly having insulation supports and a plurality of heater elements, the insulation supports mounted to the housing, the plurality of heater elements mounted to the insulation supports. The load bank further comprises at least one fan to cool the plurality of heater elements.

The present invention, in one embodiment, is directed to a load bank, comprising a housing, a user interface located on the housing, the user interface having at least one control, and at least one heater located in the housing and controlled by the control, wherein the control configures the heater to act as a test load for testing a power source.

The present invention, in one embodiment, is directed to a system. The system comprises a power source and a load bank in communication with the power source. The load bank comprises a housing, a user interface located on the housing, the user interface having at least one control, and at least one heater located in the housing and controlled by the control, wherein the control configures the heater to act as a test load for testing a power source.

BRIEF DESCRIPTION OF THE DRAWINGS

Other objects and advantages of the invention will become apparent upon reading the following detailed description and upon reference to the drawings.

FIGS. 6A and 6B are tables showing the different test loads that may be selected in the load bank according to one embodiment of the present invention.

Figure 1:
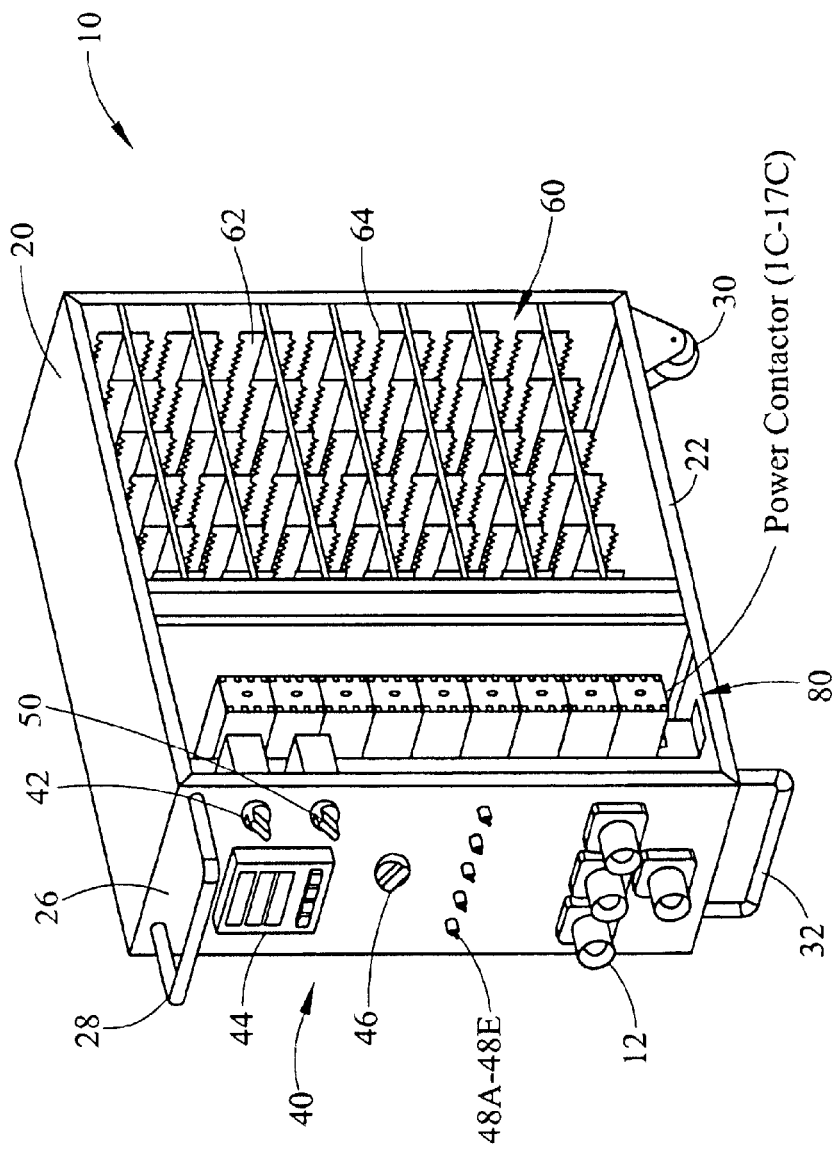
FIG. 1 is a perspective view of the air exhaust side (with side panel removed) of a load bank according to one embodiment of the present invention.
Figure 2:
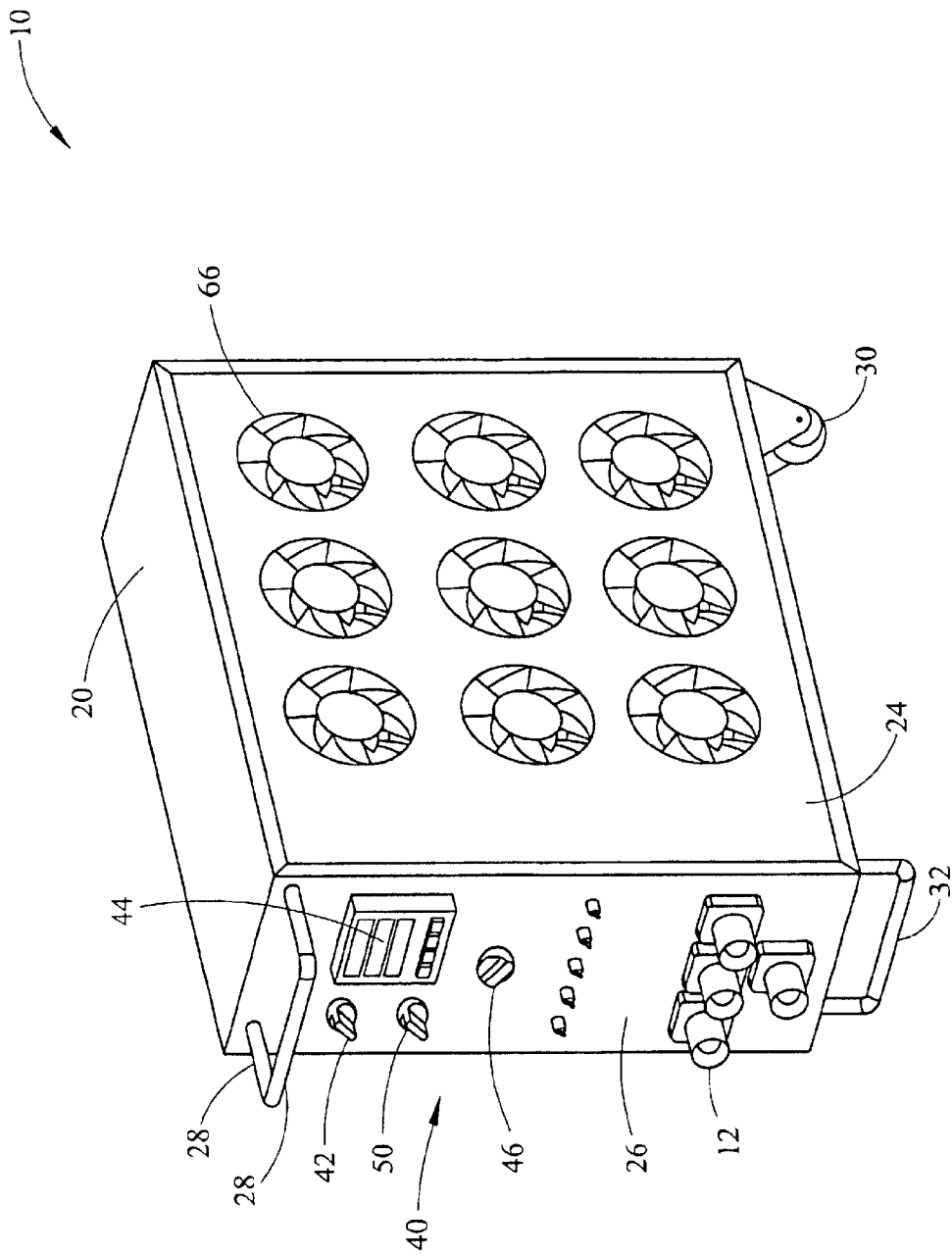
FIG. 2 is a perspective view of the air inlet side of the load bank in FIG. 1 according to one embodiment of the present invention.
Figure 3:
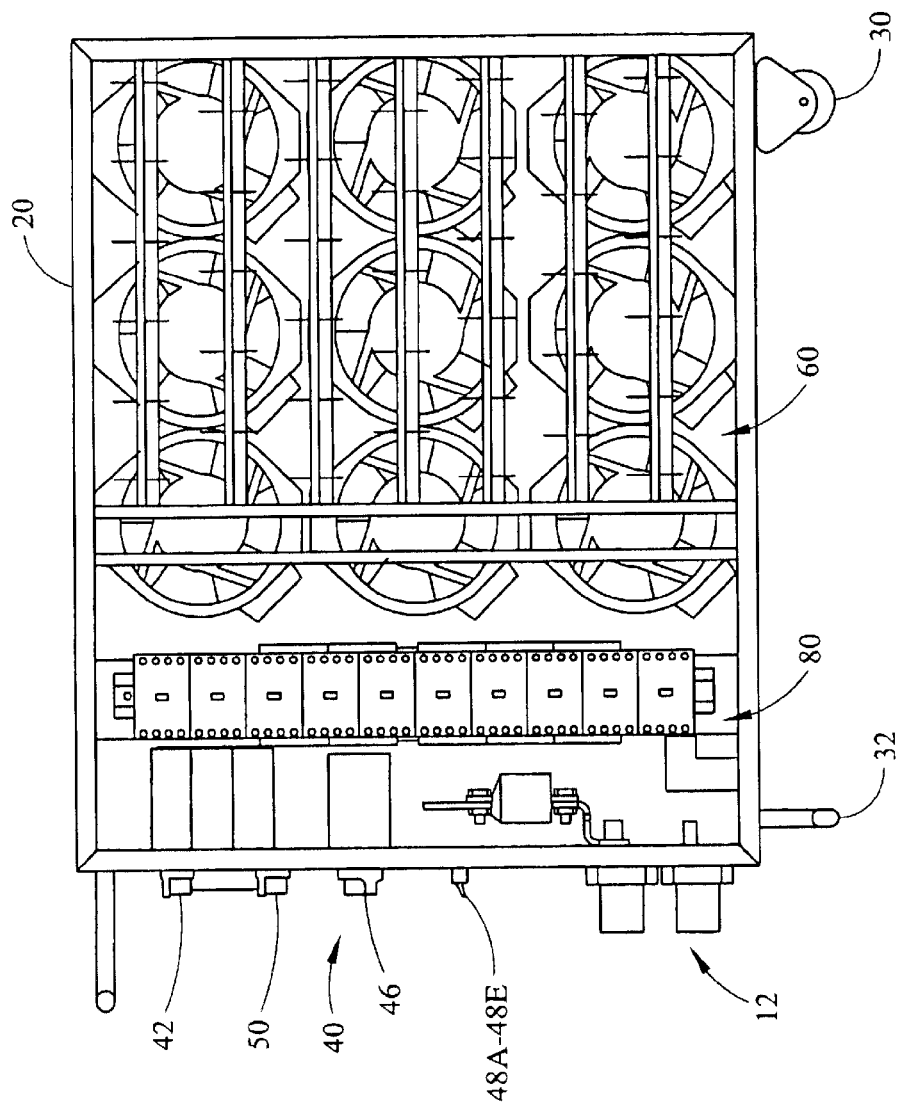
FIG. 3 is a plan view of the air exhaust side (with side panel removed) of the load bank in FIG. 1 according to one embodiment of the present invention.
Figure 5:
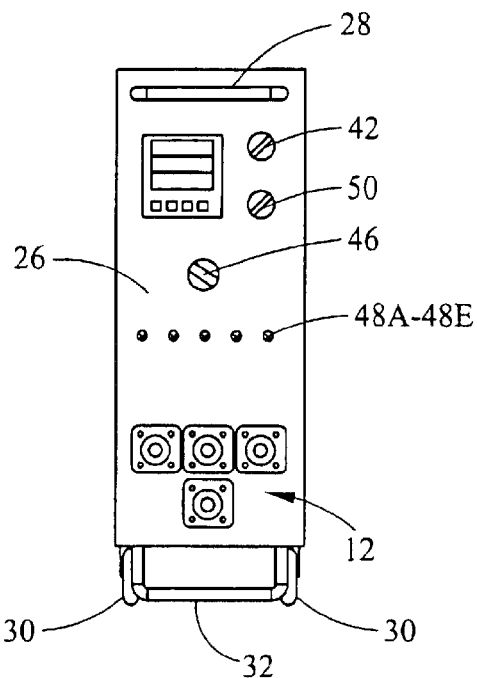
FIG. 5 is an end view of the load bank in FIG. 1 showing the user interface according to one embodiment of the present invention.
Figure 4:
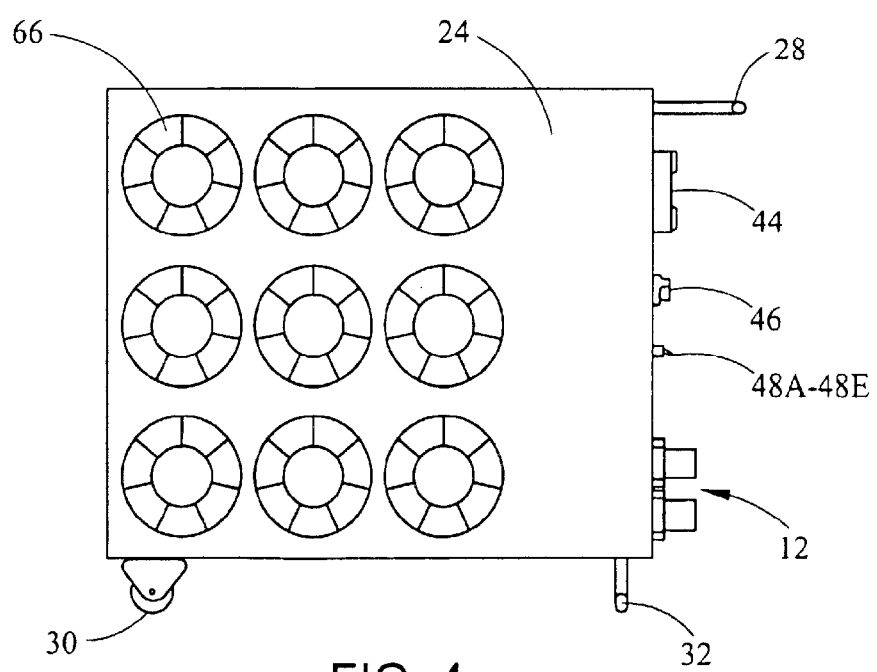
FIG. 4 is a plan view of the air inlet side of the load bank in FIG. 1 according to one embodiment of the present invention.

While the invention is susceptible to various modifications and alternative forms, certain specific embodiments thereof have been shown by way of example in the drawings and will be described in detail. It should be understood, however, that the intention is not to limit the invention to the particular forms described. On the contrary, the intention is to cover all modifications, equivalents, and alternatives falling within the spirit and scope of the invention as defined by the appended claims.

DESCRIPTION OF ILLUSTRATIVE EMBODIMENTS

Illustrative embodiments will now be described with reference to the accompanying figures. Turning to the drawings, FIGS. 1–5 depict a load bank 10 having an outer housing 20, a user interface 40, a heating element assembly 60, and control circuitry 80.

In one embodiment, the outer housing 20 has an air exhaust side 22, an air inlet side 24, and a front side 26. Attached to the outer housing 20 is a handle 28, wheels 30 and a support leg 32. This allows the load bank 10 to be portable. To move the load bank 10, an operator simply lifts the handle 28 so that the support leg 32 is not touching the ground. The wheels 30 allow a single operator to pull the load bank 10 to test another power system or for subsequent storage.

The outer housing 20 may also include terminals 12 to connect the load bank 10 to the power system to be tested. In the embodiment shown in FIGS. 1–5, the terminals 12 are located on the front side 26 of the housing 20. The embodiment shown in the figures is based on a three-phase power source from wires L1, L2, L3, GND. The present invention, however, is not limited to three-phase power sources and a person of ordinary skill in the art with the benefit of the present specification would realize that other types of power sources could be used including single-phase power sources. In this three-phase embodiment, the terminals 12 may be CAM-LOK connectors, although other connectors may be used.

The air exhaust side 22 and the air inlet side 24 allow air to pass through the load bank 10. Air is forced by the fans 66 from the air inlet side 24 to the air exhaust side 22 to cool the heating elements 64.

The user interface 40 allows the operator to configure the load bank 10 for a specific test. In one embodiment, the user interface 40 is located on the front side 26 and includes a power switch 42, a digital meter 44, load switches (selector switch 46 and load stage switch(s 48A–48E), and a voltage selector 50. As will be explained further below, the power switch 12 provides power to the components in the control circuitry 80.

In one embodiment, the load switches (selector switch 46 and load stage switches 48A–48E) allow an operator to select a test load between 0 and 100 KW at 1-KW increments. In this embodiment, the selector switch 46 has six positions that enable an operator to select the following six smaller loads: 0-kW, 1-kW, 2-kW, 3-kW, 4-kW, 5 kW. The load stage switches 48A–48E allow an operator to select the following five larger loads: 5-kW, 10-kW, 20-kW, 20 kW and 40-kW. The unique combination of the selector switch 46 and the load stage switches 48A–48E permit an operator to select a test load every 1-kW increment. This is demonstrated in the tables shown in FIG. 6.

The digital meter 44 provides indication of the voltage, current, power, and frequency. This allows the load bank 10 to report to an operator actual testing parameters so that the operator may make appropriate adjustments to the load bank 10. The voltage selector 50 enables the load bank 10 to operate at different voltages. In one embodiment, the voltage selector 50 provides for a low voltage (240V) and a high voltage (480V). As explained further below, the voltage selector 50 is connected to a series of switch contacts that configure the control circuitry 80 and the power lines to the fans 66.

The heating element assembly 60 includes insulation supports 62, heating elements 64, and fans 66. The insulation supports 62 may be made of, for example, mica, ceramic or other insulating material. In one embodiment, the insulation supports 62 have notches to hold and retain the heating elements 64. In one embodiment, the heating elements 64 are open coil elements although other types may be used such as, for example, ribbon or metal sheath heater elements.

Figure 7A:
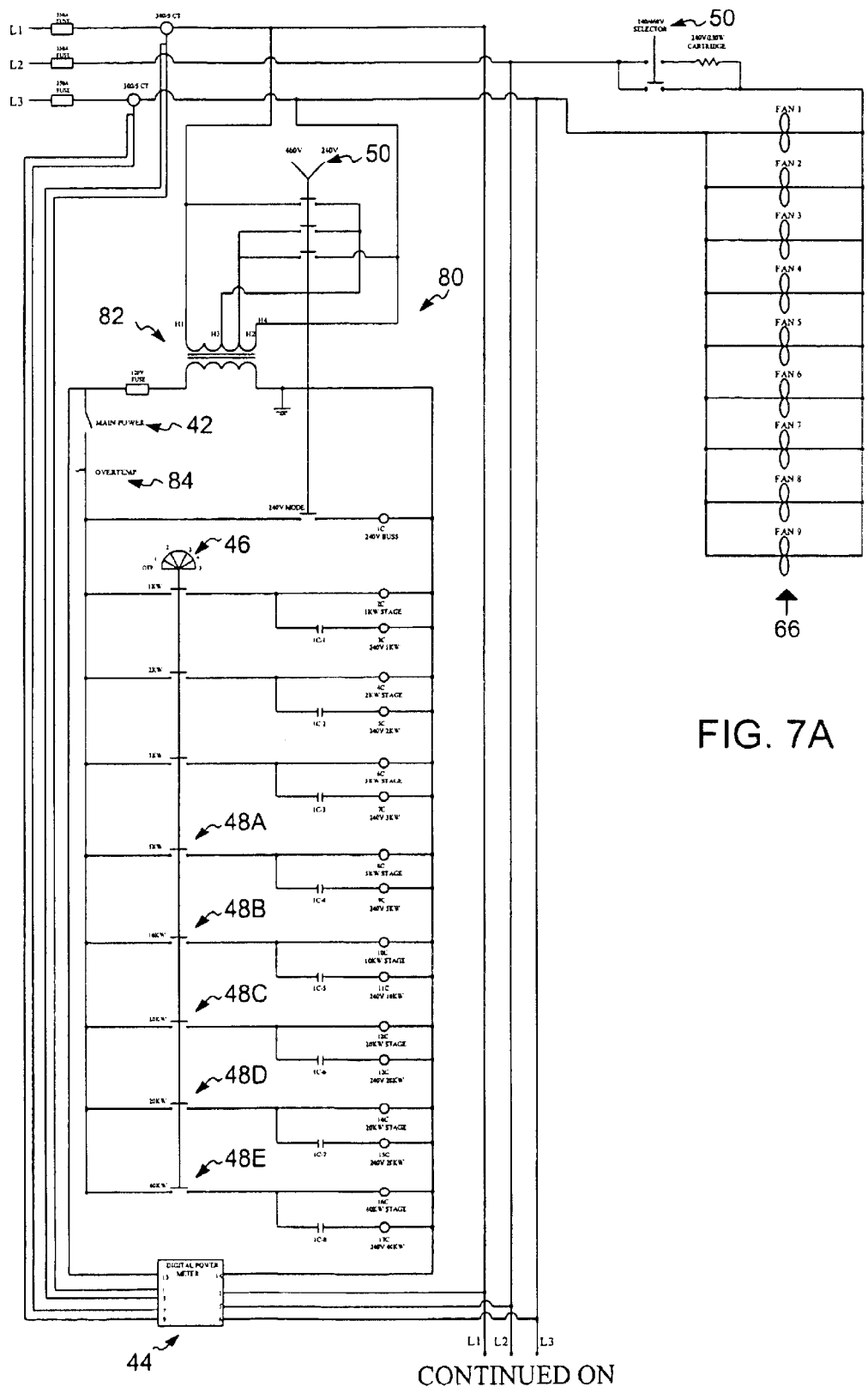
FIGS. 7A and 7B are electrical schematics for the load bank in FIG. 1 according to one embodiment of the present invention.
Figure 7B:
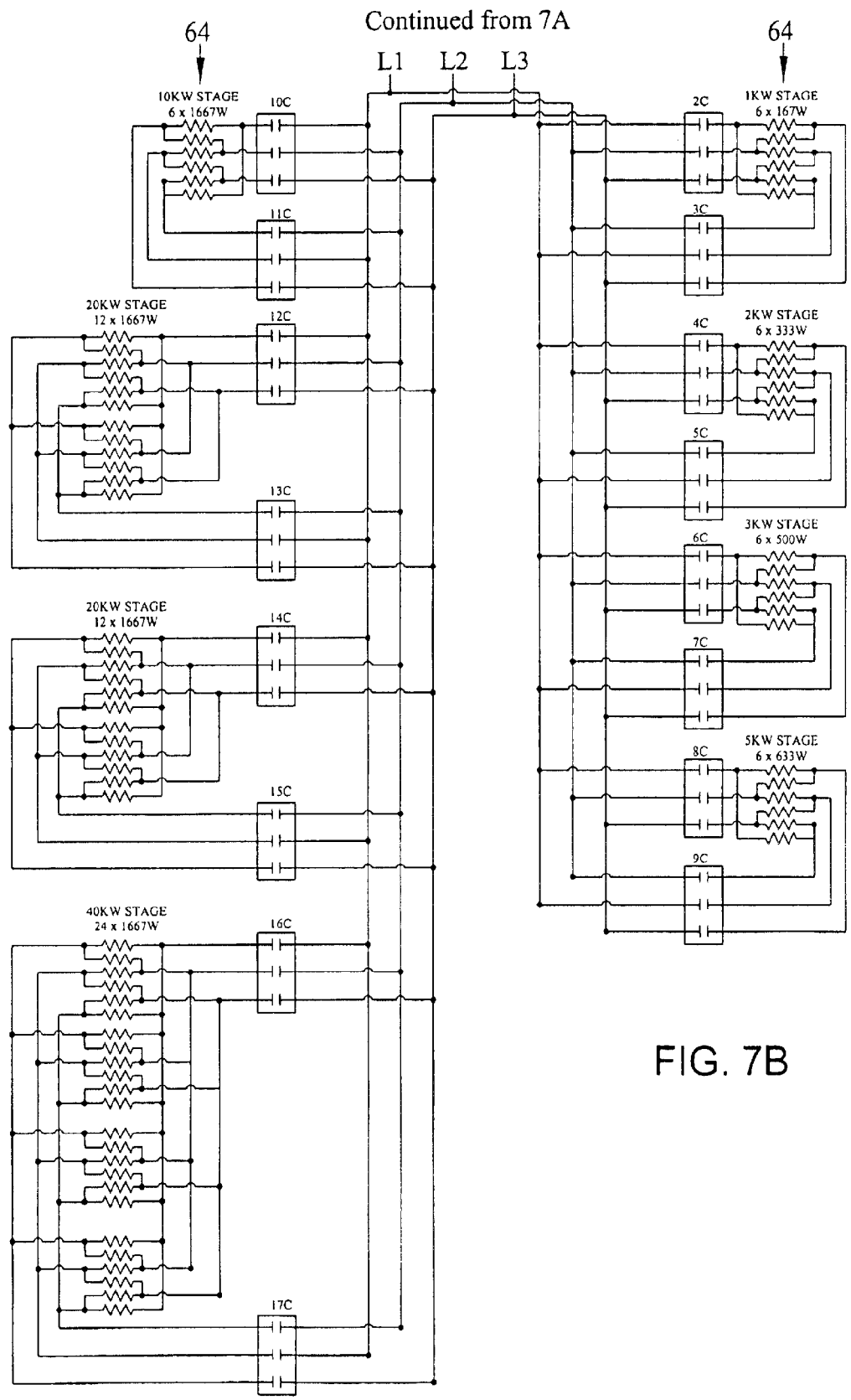

An embodiment of the control circuitry 80 is shown in FIGS. 7A and 7B. The control circuitry 80 provides control to the heating elements 64. The control circuitry 80 is integrated with the user interface 40 to provide operator input features (namely, power switch 42, selector switch 46, load stage switches 48A–48E, and voltage selector 50) and operator indicators (namely, the digital meter 44).

In one embodiment, in addition to the components of the user interface 40, the main components of the control circuitry 80 include a transformer unit 82, isolation contactors 1C–17C, and a temperature limiting switch 84. The control circuitry 80 may also include one or more power fuses to protect the unit as shown in FIG. 7A.

The incoming power from power lines L1, L2, L3 (from the power system being tested) are connected to heater elements 64 as shown in FIG. 7B. Intervening isolation contactors 2C–17C prevent power from actually reaching the heater elements 64 until the operator configures the input switches (i.e., selector switch 46, load stage switches 48A–48E, and voltage selector 50). The heater elements 64 are configured to provide several different load stages. In one embodiment, the load bank 10 includes the following eight different load stages: 1-kW, 2-kW, 3-kW, 5-kW, 10-kW, 20-kW, 20-kW and 40-kW (for a total of 100-kW maximum load). One of the benefits of this design is that it allows an operator the flexibility to select a load between 0 and 100 KW at 1 KW increments, as explained above and illustrated in FIG. 6.

In one embodiment, the heater elements 64 are in a three-phase Delta configuration. Although a three-phase Delta configuration may be used because it may be easier to switch between voltages, the present invention may use other configurations such as a three-phase Wye configuration. For illustrative purposes, a three-phase Delta wiring configuration is described. In such an embodiment, for each load stage, intervening circuitry (2C–17C) intercepts the power lines L1, L2, L3 before they connect to the heating elements 64.

Power from lines L1 and L3 diverts to the control circuitry 80 through the transformer unit 82, where the power supply is stepped to a desired level. The power from the transformer unit 82 supplies the control circuitry 80 with power. The voltage selector 50 configures the transformer unit 82 for the proper voltage as shown in FIG. 7A.

In one embodiment, the power switch 42 is connected between the incoming power from transformer unit 82 to the various components of the control circuitry 80. When an operator turns on the power switch 42, power is supplied to the control circuitry 80.

The selector switch 46 is coupled to isolation contactors 2C–7C and controls the power supplied through three heat load stages (1-kW, 2-kW, 3-kW). These three heat load stages provide an operator of the selector switch 46 with a total of five test loads (1-kW, 2-kW, 3-kW, 4-kW, 5-kW). Using only three heat load stages; for five test loads reduces the number of heating elements 64, thus making the load bank 10 more compact and efficient.

As shown in FIG. 7A, at the higher voltage (480V), the selector switch 46 closes certain contacts to provide power to isolation contactors 2C, 4C, and/or 6C. This, in turn, connects certain heating elements 46 to the power lines L1, L2, L3 as shown in FIG. 7B. At the lower voltage (240V), the selector switch 46 closes certain contacts to provide power to isolation contactors 2C, 3C, 4C, 5C, 6C, and/or 7C. Accordingly, as shown in FIGS. 7A and 7B, each heat load stage has two associated contactors. The pair of contactors allows each stage to be operated at two different voltages while producing the same power load.

The load stage switches 48A–48E art coupled to isolation contactors 8C–17C and control the power supplied through five heat load stages (5-kW, 10-kW, 20-kW, 20-kW, 40-kW). When the voltage selector 50 is set at the higher voltage (480V), load stage switch 48A is capable of providing power to isolation contactor 8C, load stage switch 48B is capable of providing power to isolation contactor 10C, load stage switch 48C is capable of providing power to isolation contactor 12C, load stage switch 48D is capable of providing power to isolation contactor 14C, and load stage switch 48E is capable of providing power to isolation contactor 16C. Intervening isolation contactor 1C prevents power to isolation contactors 9C, 11C, 13C, 15C and 17C.

When the voltage selector 50 is set at the lower voltage (240V), a contact closes to provide power to isolation contactor 1C. When power is provided to isolation contactor 1C, the load stage switches 48A–48E are further capable of providing power to isolation contactors 9C, 11C, 13C, 15C and 17C, respectively.

The digital meter 44 is electrically connected to power lines L1, L2 and L3 and across she control circuitry 80 to provide an operator with voltage, current, power, and frequency.

Power from the lines L2 and L3 diverts to a series of fans 66. The power from the lines L2 and L3 supplies the fans 66 with power. The fans 66 run on line voltage (e.g. 240V).

Accordingly, a cartridge heating element may be used on line L2 to drop the voltage if the voltage selector 50 is set at the higher voltage (480V). An alternative way to drop the voltage for the fans. 66 would be to use a transformer.

The control circuitry 80 also includes a temperature limiting switch 84. The temperature limiting switch 84 is a safety device used to protect the load bank 10 from excessive temperatures. If the internal temperature of the load bank reaches a predetermined temperature, the temperature limiting switch 84 will shut power to other components of the control circuitry 80. This, in turn, will shut power from lines L1, L2 and L3 to the heating elements 46.

As various changes could be made in the above constructions without departing from the scope of the invention, it is intended that all matter contained in the above description or shown in the accompanying drawings shall be interpreted as illustrative and not in a limiting sense. For example, one of ordinary skill in the art, having the benefit of this specification, would realize that a controller with a series of electrical or solid state switches (such as silicon controlled rectifiers or triacs) could be used in place of the mechanical switches and contacts described herein.

What has been described is a compact and portable load bank designed to provide an electrical power load for testing power systems, such as a generator or other back-up power supplies. The load bank consists of electrical resistance heaters, fans and controls within a portable housing. The controls allow an operator to select a desired load level at very small increments. The controls further allow an operator to select a desired voltage. Power switching components activate the proper heating elements to obtain the desired test load and test voltage. Fans blow air over the heating elements to remove heat that may build up inside the load bank. In view of the foregoing, it will be seen that the several objects of the invention are achieved and other advantageous results are obtained.

What is claimed is:

1. A load bank for testing a power source, the load bank having at least one terminal to connect to the power source, the load bank comprising:
    a housing;
    a user interface attached to the housing, the user interface having a means for configuring a test load and a means for configuring a test voltage, the means for configuring a test load including a load stage switch and a load selector switch, the load stage switch enabling an operator to select a test load in first increments up to a maximum test load, the load selector switch enabling an operator to select a test load in second increments within the first increments, the combination of the load stage switch and the load selector switch enabling an operator to select a test load in second increments up to the maximum test load;
    a heater element assembly having insulation supports and a plurality of heater elements, the insulation supports mounted to the housing, the plurality of heater elements mounted to the insulation supports; and
    at least one fan to cool the plurality of heater elements.

2. The load bank of claim 1, wherein the power source is a three-phase power source.

3. The load bank of claim 1, wherein the housing includes an air exhaust side and an air inlet side to allow air to pass through the housing.

4. The load bank of claim 1, wherein the means for configuring the test load includes at least one load selector switch electrically connected to control circuitry.

5. The load bank of claim 4, wherein the at least one load selector switch enables an operator to select the test load in increments of 1-kW.

6. The load bank of claim 4, wherein the means for configuring a test load further includes a plurality of load stage switches electrically connected to the control circuitry.

7. The load bank of claim 6, wherein the plurality of load stage switches enable an operator to select the test load from a group of 5-kW, 10-kW, 20-kW, 30-kW and 40-kW.

8. The load bank of claim 1, wherein the means for configuring the test voltage includes at least one voltage selector switch electrically connected to control circuitry.

9. The load bank of claim 8, wherein the at least one voltage selector switch enables an operator to select the test voltage of 240V or 480V.

10. The load bank of claim 1, wherein the means for configuring the test load enables an operator to select the test load between 0-kW and a maximum test load at 1-kW increments.

11. The load bank of claim 10, wherein the maximum test load is 100-kW.

12. A load bank, comprising:
    a housing;
    a user interface located on the housing, the user interface having at least one control, the control including a load stage switch and a load selector switch, the load stare switch enabling an operator to select a test load in first increments up to a maximum test load, the load selector switch enabling an operator to select a test load in second increments within the first increments, the combination of the load stage switch and the load selector switch enabling an operator to select a test load in second increments up to the maximum test load; and
    at least one heater located in the housing and controlled by the control, wherein the control configures the heater to act as a test load for testing a power source.

13. The load bank of claim 12, further comprising at least one fan located in the housing.

14. The load bank of claim 12, further comprising at least one control circuit.

15. The load bank of claim 12, wherein the heater includes an open coil heating element.

16. A system, comprising:
    a power source; and
    a load bank in communication with the power source, wherein the load bank comprises:
        a housing;
        a user interface located on the housing, the user interface having at least one control, the control including a load stare switch and a load selector switch, the load stage switch enabling an operator to select a test load in first increments up to a maximum test load, the load selector switch enabling an operator to select a test load in second increments within the first increments, the combination of the load stage switch and the load selector switch enabling an operator to select a test load in second increments up to the maximum test load; and
        at least one heater located in the housing and controlled by the control, wherein the control configures the heater to act as a test load for testing a power source.

17. The system of claim 16, wherein the load bank further comprises a fan located in the housing.

18. The system of claim 16, wherein the heater includes an open coil heating element.

19. The system of claim 16, wherein the power source is a three-phase power source.

20. The system of claim 16, wherein the power source is in communication with the load bank via at least one wire connected to a CAM-LOK terminal on the housing of the load bank.

* * * * *

UNITED STATES PATENT AND TRADEMARK OFFICE
CERTIFICATE OF CORRECTION

PATENT NO. : 6,833,636 B1  
DATED : December 21, 2004  
INVENTOR(S) : Steven U. Nestel and Sam W. Henry Page 1 of 1

It is certified that error appears in the above-identified patent and that said Letters Patent is hereby corrected as shown below:

Column 1,
Line 13, delete the word "is" after the word "to".

Column 3,
Line 3, delete "switch(s" and replace therewith -- switches --.

Column 4,
Line 9, delete "beating" and replace therewith -- heating --.
Line 27, delete the semicolon after the word "stages".
Line 42, delete "art" and replace therewith -- are --.
Line 62, delete "she" and replace therewith -- the --.

Column 5,
Line 4, delete the period after the word "fans".

Signed and Sealed this

Fourth Day of October , 2005

JON W. DUDAS
*Director of the United States Patent and Trademark Office*